United States Patent
Henze et al.

(10) Patent No.: US 9,773,547 B2
(45) Date of Patent: Sep. 26, 2017

(54) NON-VOLATILE MEMORY WITH MULTIPLE LATENCY TIERS

(71) Applicant: Hewlett Packard Enterprise Development LP, Houston, TX (US)

(72) Inventors: Richard H. Henze, San Carlos, CA (US); Naveen Muralimanohar, Santa Clara, CA (US); Yoocharn Jeon, Palo Alto, CA (US); Martin Foltin, Fort Collins, CO (US); Erik Ordentlich, San Jose, CA (US); Gregg B. Lesartre, Fort Collins, CO (US); R. Stanley Williams, Portola Valley, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/113,914

(22) PCT Filed: Jan. 31, 2014

(86) PCT No.: PCT/US2014/014227
§ 371 (c)(1),
(2) Date: Jul. 25, 2016

(87) PCT Pub. No.: WO2015/116188
PCT Pub. Date: Aug. 6, 2015

(65) Prior Publication Data
US 2016/0343432 A1    Nov. 24, 2016

(51) Int. Cl.
*G11C 11/00* (2006.01)
*G11C 13/00* (2006.01)
(Continued)

(52) U.S. Cl.
CPC .......... *G11C 13/004* (2013.01); *G11C 5/025* (2013.01); *G11C 11/005* (2013.01);
(Continued)

(58) Field of Classification Search
CPC .................................................. G11C 13/0002
(Continued)

(56) References Cited

U.S. PATENT DOCUMENTS 6,765,813 B2    7/2004    Scheuerlein et al.
2002/0151172 A1    10/2002    Ahn et al.
(Continued)

FOREIGN PATENT DOCUMENTS

KR    102001007630 A    8/2001
WO    WO-2012033533 A1    3/2012

OTHER PUBLICATIONS

Flash Memory Summit—2014 Preview Program, 2014 Flash Memory Summit and Exhibition, Aug. 5-7, 2014, Santa Clara Convention Center/Santa Clara, CA, 12 pages.
(Continued)

*Primary Examiner* — Hoai V Ho
(74) *Attorney, Agent, or Firm* — Fabian Vancott

(57) ABSTRACT

A non-volatile memory device with multiple latency tiers includes at least two crossbar memory arrays, each crossbar memory array comprising a number of memory cells, each memory cell connected to a word line and a bit line at a cross point. The crossbar memory arrays each have a different latency. The crossbar memory arrays are formed on a single die.

20 Claims, 7 Drawing Sheets

(51) Int. Cl.
*H01L 45/00* (2006.01)
*H01L 27/24* (2006.01)
*G11C 5/02* (2006.01)
*H01L 23/528* (2006.01)

(52) U.S. Cl.
CPC ........ *G11C 13/0069* (2013.01); *H01L 23/528* (2013.01); *H01L 27/2463* (2013.01); *H01L 27/2481* (2013.01); *H01L 45/04* (2013.01); *H01L 45/06* (2013.01); *H01L 45/085* (2013.01); *H01L 45/1233* (2013.01); *H01L 45/14* (2013.01); *H01L 45/142* (2013.01); *H01L 45/143* (2013.01); *H01L 45/144* (2013.01); *H01L 45/146* (2013.01); *H01L 45/147* (2013.01); *G11C 13/0004* (2013.01); *G11C 13/0007* (2013.01); *G11C 13/0011* (2013.01); *G11C 2213/71* (2013.01); *G11C 2213/72* (2013.01); *G11C 2213/77* (2013.01); *G11C 2213/79* (2013.01)

(58) Field of Classification Search
USPC ......................................................... 365/148
See application file for complete search history.

(56) References Cited

U.S. PATENT DOCUMENTS

| | | |
|---|---|---|
| 2008/0074928 A1 | 3/2008 | Choi |
| 2009/0010044 A1 | 1/2009 | Sakimura et al. |
| 2009/0323423 A1 | 12/2009 | Bloom et al. |
| 2011/0072201 A1 | 3/2011 | Lee et al. |
| 2011/0188284 A1* | 8/2011 | Chevallier ............... G11C 5/02 365/51 |
| 2011/0272754 A1* | 11/2011 | Tang ................. H01L 27/11563 257/314 |
| 2012/0005418 A1 | 1/2012 | Ribeiro et al. |
| 2012/0072647 A1 | 3/2012 | Lee et al. |
| 2012/0176832 A1* | 7/2012 | Chevallier ............. G11C 11/21 365/148 |
| 2012/0198128 A1* | 8/2012 | Van Aken ........... G06F 12/0246 711/103 |
| 2013/0275682 A1 | 10/2013 | Ramanujan et al. |

OTHER PUBLICATIONS

Hinkle, J., Disruptive Hybrid Storage: Fusing DRAM and NAND [online], Aug. 9, 2011, Viking, Modular Soiutions, Sanmina-SCI Corporation, Retrieved from the Internet: <http://www.flashmemorysummit.com/English/Coilaterals/Proceedings/2011/20110800_F2A_Hinkie.pdf. [retrieved on Oct. 23, 2013], 16 pages.

International Search Report & Written Opinion, Oct. 27, 2014, PCT Patent Application No. PCT/US2014/014227, 14 pages.

Mellor, C., Micron Glues DDR4 RAM to Flash, Animates the 256GB Franken-DIMM, Feb. 13, 2013, The Register, 2 pages.

Ryu, M., et al., Why are State-of-the-art Flash-based Multi-tiered Storage Systems Performing Poorly for HTTP Video Streaming?, Jun. 7-8, 2012, NOSSDAV 2012, 6 pages.

Varsamou, M., et al., Variability of NVM Response Time and Its Effect on the Performance of Consumer SSDS, Jul. 22, 2013, 2013 IEEE Third International Conference on Consumer Electronics—Berlin (ICCE-Berlin), pp. 226-230.

Walls, A., Caching in Shared Environments [online], 2013; Flash Memory Summit 2013, <http://www.flashmemorysummit.com/English/Collaterals/Proceedings/2013/20130814_D21_Walls.pdf> [retrieved on Oct. 23, 2013]. 12 pages.

* cited by examiner

NON-VOLATILE MEMORY WITH MULTIPLE LATENCY TIERS

BACKGROUND

Computer architectures having multiple tiers of memory or storage in a hierarchy are important in modern computational strategies that leverage data locality to reduce average data access time, improving overall performance and energy efficiency. Multi-tiered systems may include as different tiers either memory or storage. Examples of memory tiers in a multi-tiered system may include Static Random Access Memory ("SRAM") and Dynamic Random Access Memory ("DRAM"), which may be organized as different levels of cache and main memory. Examples of storage tiers in a multi-tiered system may include Solid State Drives ("SSD"), magnetic disks and data tapes.

Different memory tiers may provide different trade-offs between different desired memory characteristics. Specifically, the decision of which memory tiers, storage tiers or combinations thereof to employ in a system generally involves tradeoffs between capacity and speed, dictated by cost tradeoffs. Memory tiers with faster performance, for example, typically cost more, and so are oftentimes reserved for specialized tasks, such as cache memory applications. Memory tiers with slower performance, on the other hand, cost less and so are reserved for large data memory applications, such as main memory. In such configurations, the disparate classes of memory are generally manufactured separately, e.g., as separate devices or on separate chips, and located at different segments of the memory architecture.

BRIEF DESCRIPTION OF THE DRAWINGS

The accompanying drawings illustrate various examples of the principles described herein and are a part of the specification. The illustrated examples are merely examples and do not limit the scope of the claims.

FIG. 8 illustrates a method of operating a non-volatile memory device with multiple latency tiers according to one example of the principles described herein.

DETAILED DESCRIPTION

The emergence of multiple classes of non-volatile memory ("NVM"), having disparate performance, cost and capabilities, permits more localized placement of the various classes or categories of memory in a multi-tiered system, leading to increased performance and efficiencies of computer architectures at lower cost. For example, according to the principles disclosed herein, different classes of NVM may be incorporated onto a single chip, leading to reduced latencies and increased overall performance of typical computer architectures. This is realized in particular examples where categories of NVM approach memory-like performance or where fine-grain tiers and control/migration policies enable improved system performance. Some potential instances of this include the case when useful capacities of each tier can be achieved on a single die or package, or when a controller can effectively utilize fester (lower latency) tiers to mask the slower characteristic of a larger tier. The principles described herein facilitate increased system performance and efficiency at lower cost through use of multiple tiers of memory or storage having different types of circuit or cell combinations that are manufactured within the same fabrication process.

Figure 1:
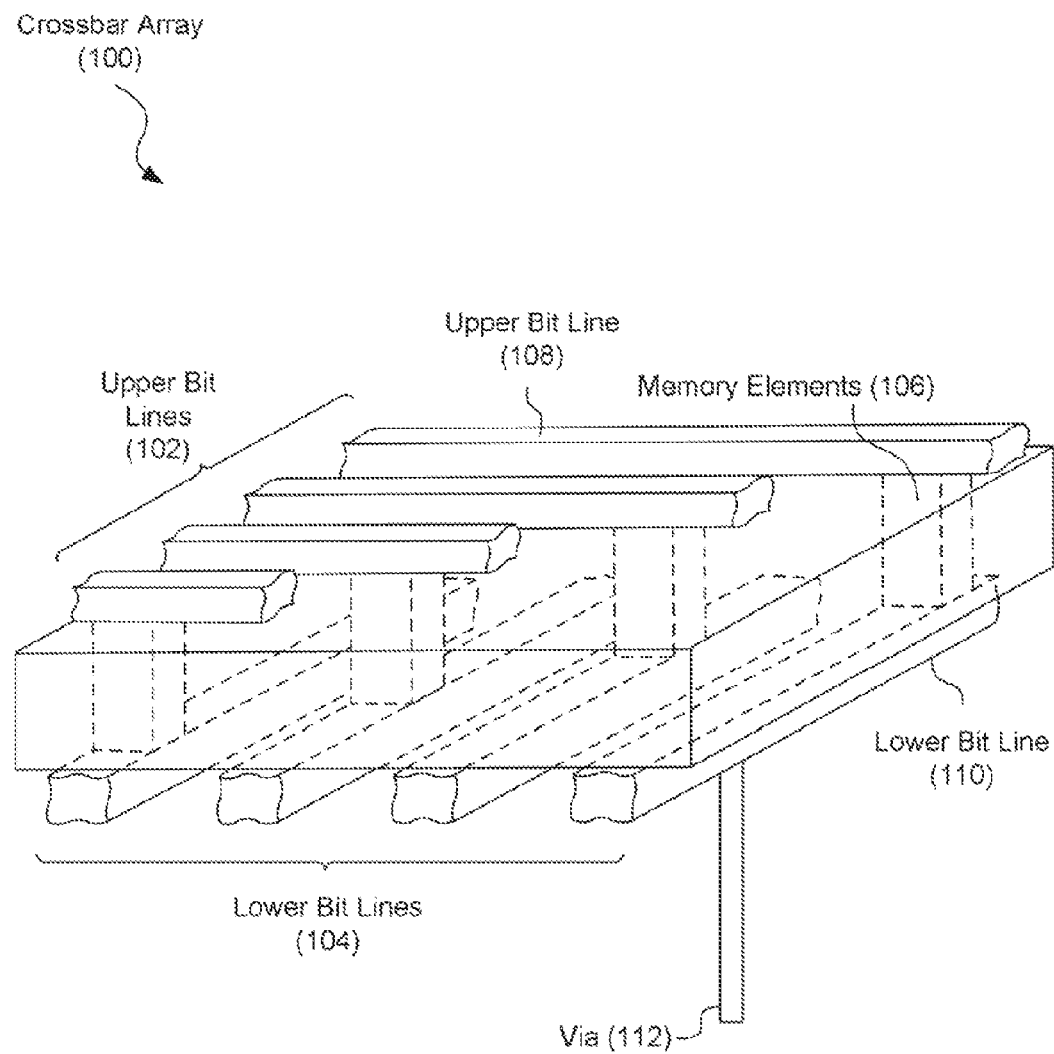
FIG. 1 is a diagram showing an illustrative crossbar array, according to one example of the principles described herein.

This specification provides an apparatus, system and method to implement multiple performance tiers of non-volatile memory ("NVM") in a single device, such as on a single die, by including multiple types of different configurations of NVM circuits or NVM technology types in a single device. These principles can be applied to different memory types including for example, resistive Random Access Memory ("ReRam") and memristor memories. For cost-effective dense embodiments, these memory technologies typically include a crossbar array, such as illustrated in FIG. 1, with a programmable memory element or device and a selector (or, simply, memory element) at each intersection.

In the following description, for purposes of explanation, numerous specific details are set forth in order to provide a thorough understanding of the present systems and methods. If will be apparent, however, to one skilled in the art that the present systems and methods may be practiced without these specific details. Reference in the specification to "an example" or similar language means that a particular feature, structure, or characteristic described in connection with the example is included in at least that one example, but not necessarily in other examples. The various instances of the phrase "in one example" or similar phrases in various places in the specification are not necessarily all referring to the same example. The principles disclosed herein will now be discussed with respect to illustrative systems and methods.

As used herein, the term "memory element" or "programmable memory element" (sometimes referred to as "memory cell") refers to a programmable device that can be programmed to store at least a single bit of data. The memory element may include a non-volatile switch, such as a memristor, or it may include both a switch and a selector. The term "memory circuit" or "memory circuitry" refers to other components such as decoders, sense amplifiers, etc., that support operation of a memory element. A memory array consists of a set of memory elements and circuits associated with them. The term "data density" refers to a quantity of data that may be stored in a memory array per unit area. Thus, irrespective of the dimension (number of elements) of the array, one array may be able to store more data in the same amount of physical area as a second, differently constructed, array.

Memory "latency," as used herein refers to how quickly data can be written to or read from the memory device. A low latency means the data can be retrieved or written relatively quickly. A high latency is less desirable and means that data retrieval or writing takes relatively more time.

Referring now to the figures, FIG. 1 is a diagram showing an illustrative crossbar memory array or architecture (100).

According to certain illustrative examples, the crossbar memory array (100) may include an upper set of wires (102) which are generally laid in parallel and connected to one end of the memory elements. Additionally, a lower set of set of wires (104) lay perpendicular to the upper set of wires (102) and connects to the other end of the memory elements. The upper and the lower wires (sometimes referred to as lines) may be referred to as word lines or bit lines, depending on how data is written to or read from the memory array (100).

Programmable memory elements or memory cells (106) are sandwiched between an upper wire (108) and a lower wire (110). For purposes of illustration, the upper set of parallel wires will sometimes be referred to as row lines and the lower set of parallel wires will sometimes be referred to as column lines. Terms such as row, column, upper, and lower are not used to indicate a specific position or orientation. Rather, the terms are used to distinguish position or orientation relative to one another. A number of vias (112) may connect the word and bit lines to additional shared circuitry that accesses the memory elements and/or to a controller that operates the crossbar memory array for reading or writing data, or to additional layers of crossbar memory array elements or cells.

According to certain illustrative examples, the programmable memory elements (108) may be memristive devices, and each such programmable or memory device can additionally have a selector in series with the memory device (or switch). This selector will be explained in greater detail below, in one example, the selector and programmable device may be combined adjacently in series to form a composite device. Memristive devices exhibit a "memory" of past electrical conditions. For example, a memristive device may include a matrix material that contains mobile dopants. These dopants can be moved within a matrix to dynamically alter the electrical operation of an electrical device, such as the resistance of that device. In other examples, the programmable memory elements (106) may be other types of ReRAM devices.

With ReRAM devices, memristor devices and other memory technologies, a memory array can be constructed differently to trade off such characteristics as memory size or density and memory latency. By way of example, different types of memory are described below, each representing a different trade-off between density and latency. Each memory type is constructed using a different type of memory element or cell or accompanying circuitry, as will be described below. Memristor arrays can be broadly classified into two categories. First, a crossbar design in which memristor devices are directly sandwiched between the intersections of word lines and bit lines, in some examples, each memristor device can be coupled to a selector in series with the switch device. Second, a more traditional design is one in which a dedicated access transistor is connected to each cell along with the memristor device. Turning an access transistor on or off controls exclusive access to that specific memristor device. Within a crossbar design, one can trade off density for access latency by controlling the dimensions of the crossbar array and the design details of the associated peripheral circuits, which are typically CMOS circuits connected to the appropriate locations within the crossbar array by vias.

In a design using access transistors, the transistors connect and disconnect memory elements from the reading/writing circuits, e.g., sense amplifiers, decoders, etc. These transistors have very high ON/OFF ratios and prevent leakage currents (sometimes referred to as half-select currents or sneak currents) from passing through memory devices or elements that are not selected for reading or writing. Such a design is illustrated schematically in FIG. 2. An illustrative memory circuit (208) includes a transistor (220) and a programmable memory element (222), such as a memristive memory device or ReRAM device. This configuration is sometimes referred to as "1T1R." One skilled in the art will appreciate that while the schematic indicates the transistor (220) is located adjacent the memory element (222) at an intersection in a crossbar array, in some examples, the transistor is actually located on a CMOS layer that may be several layers removed from the memory element (222).

In this illustrative memory circuit (206), the transistor (220) isolates the memory element (222) from other cells or elements in the array to minimize any leakage current that might make the data in the memory element (222) harder to detect accurately. As a result, this memory element (222) can be read more quickly and reliably than would be the case without the transistor present. This circuit design provides a very low latency. However, including the transistor (220) in each memory circuit increases the underlying circuit area required to support each memory element (222). Consequently, a memory array using 1T1R circuitry will generally have lower density and be unable to include as many memory cells in the same area as would be the case for designs not using a transistor. Consequently, low latency is achieved, but at the expense of memory density and storage capacity.

In a second memory type, a selector is included within the memory circuit. For example, referring to FIG. 2, a memory circuit (204) includes a memory element having both a selector and a programmable device or switch. This illustrative memory element, connected at an intersection of the wires of a crossbar array, includes a programmable device (216), such as a memristive or ReRAM device. The programmable device (216) is coupled with a nonlinear selector (218), which exhibits a high degree of nonlinearity in the current-voltage characteristics. This configuration is sometimes referred to as "1S1R."

The nonlinear selector (218), like the transistor described above, creates a threshold to minimize the disturbance of half-selected memory elements or cells and controls for leakage current that would otherwise make the data in the programmable device (216) harder to discern during a reading operation. Consequently, the selector (218) decreases the latency of a memory array over an array that does not use a selector in each memory element. By limiting current though the half-selected cells or elements, the selector also decreases the current requirements and hence the size of the row and column driving transistors, thereby allowing for increased density by reducing the area needed for supporting circuitry.

The latency of such memory cells illustrated in the circuit (204) is not as low as with the previous circuit discussed, which includes both a memory element (222) and a transistor (220). However, the space required for the memory cell in the present circuit (204) is less than that for the memory cell In the previous circuit (206), which includes the transistor. Consequently, the present memory circuit (204) represents a memory structure in which latency has increased somewhat compared to the previous example, but memory density, i.e., storage capacity, for the same areal footprint has improved. The degree of need for the non-linear selectors (218) in the memory elements is dictated by the inherent nonlinearity of the programmable device (216). With TaOx, for example, and many other transition metal oxide based ReRAM devices that exhibit high endurance, there is relatively small nonlinearity, so a selector is required for practical crossbar array systems.

In a third memory type, a memory circuit (202) includes only a programmable device (212) connected between intersecting wires of a crossbar array; no selector is included. Again, this programmable device (212) could be, for example, a memristive or ReRAM device. Without a selector to control for leakage or sneak currents, this memory element is relatively more difficult to read accurately. Thus, the latency of a memory array constructed using such memory elements would be the highest of the three examples discussed with reference to FIG. 2. However, without any components in the memory cell other than the programmable device (212) as the memory element, the resulting arrays can be manufactured less expensively than the counterparts having selectors, though the areal footprint and, thus, density, can be similar to a memory element with selector. Thus, the memory element illustrated in the present circuit (202) provides a lower cost alternative at the expense of relatively high latency.

In one example employing multiple types of memristor-based memories, supporting circuitry could access one type of memory structure—e.g., one of the circuits (202, 204, 206) above discussed. The memory structure could be fabricated on one or more layers that include the series selector (218). Different supporting circuitry could access a second type of memory structure fabricated on different layers that do not require the additional processing and related cost of the selectors (218).

With a memory structure employing only programmable devices, such as the circuit (202) described above without the selector (218), another factor for consideration is the size of the array. For crossbar based designs, one can maximize density by trading off leakage/sneak currents in an array. For example, greater dimensioned arrays can be fabricated with higher densities, which will increase the overall sneak currents in the array. This, however, will reduce the read noise margin, increase the required energy per bit and, in some cases, lead to write failure or write disturbance. The effect of small increases in sneak currents can, however, be mitigated by having longer settling times for the sense amplifiers which will correspond to longer access latency, if the sneak current increase is significant, then data stored in the array could be preprocessed or encoded to minimize sneak currents. This, however, will again increase the overall access latency. Further, if the crossbar array is relatively large, the wires of the crossbar and other elements will exhibit an intrinsic resistance and capacitance that will operate to increase the latency.

Figure 2:
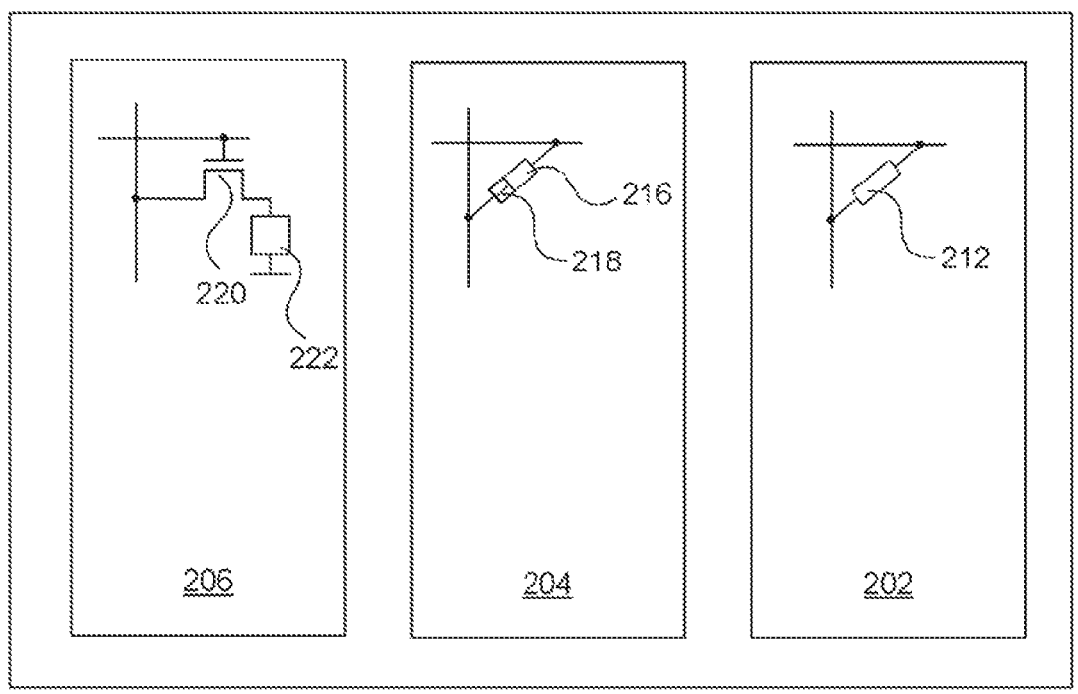
FIG. 2 is a diagram of three different crosspoint elements that might be used in a multi-tier memory device according to the principles described herein.
Figure 3:
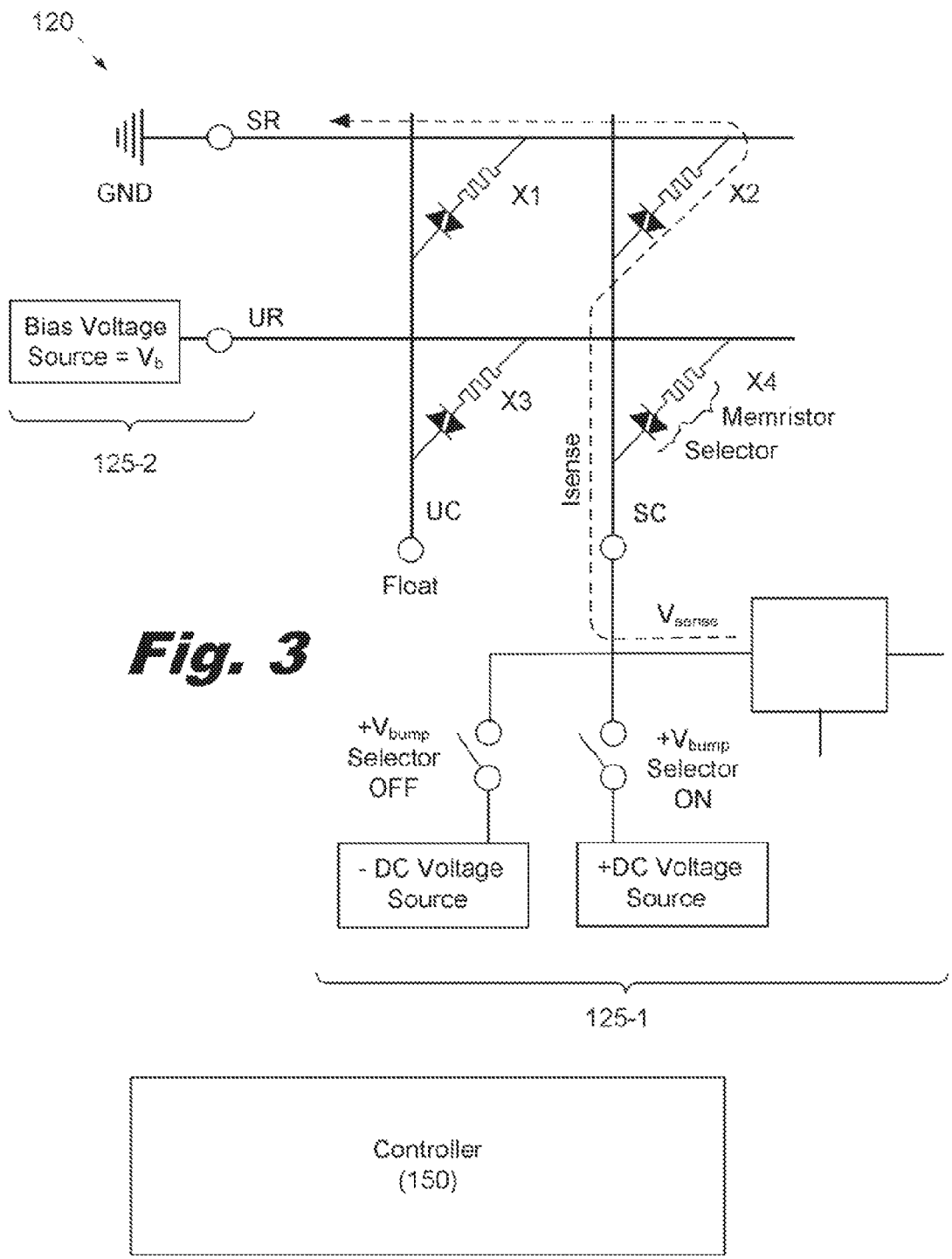
FIG. 3 illustrates an illustrative crossbar array with supporting circuitry.

FIG. 3 shows an illustrative crossbar array (120) using memory cells according to the second type of circuit (204) described with reference to FIG. 2—i.e., a memory element or cell that includes a programmable device and a non-linear selector to control the sneak or leak currents, and the supporting circuitry (125). The crossbar memory array (120) includes a number of rows (SR, UR) that are electrical conductors represented by horizontal lines in the circuit diagram. A number of columns (UC, SC) are electrical conductors that cross over (or intersect with) each of the rows. The rows and columns are spaced apart a small distance, with memory elements (X1, X2, X3, X4) positioned at and connecting the "intersecting" rows and columns at the cross points.

The memory elements in this example include a nonvolatile switch (indicated using a memristor symbol and labeled "memristor") and a volatile selector (indicated using a DIAC symbol and labeled "selector"). A "DIAC" is a "Diode for Alternating Current." that conducts current only after its breakover voltage is exceeded. The volatile selector is not literally a DIAC, but the DIAC symbol is used to graphically represent the functionality of the volatile selector. In some examples the nonvolatile switches may be memristors, resistive random access memory (ReRAM), conductive-bridging random access memory (CBRAM), phase change memory (PRAM, PCRAM), and other types of memory. For example, the elements positioned at the cross points could be resistive memory based on perovskites (such as $Sr(Zr)TiO_3$ or PCM)), transition metal oxides (such as $Ta_2O_5$, NiO or $TiO_2$), chalcogenides (such as $Ge_2Sb_2Te_5$ or AgInSbTe), solid-state electrolyte materials (such as GeS, GeSe, or $Cu_2S$), organic charge transfer complexes (such as CuTCNQ), organic donor-acceptor systems (such as Al AIDCN), and various other material and molecular systems.

The dimensions of crossbar memory arrays can vary greatly. In this example, only four cross point elements are illustrated for clarity. However, a crossbar memory array may include hundreds of row and column lines and thousands or millions of memory elements. For example, a crossbar memory array may include 1,024 rows, 1,024 columns, and have 1,048,576 memory elements, one element at each cross point. The crossbar memory array may be tiled with other memory structures to form architectures with much greater capacity. The specific details given herein are only examples. The crossbar memory array may have a variety of different sizes and architectures. Further, the supporting circuitry will influence the physical size of the crossbar array. For example, crossbar arrays having nonvolatile switches and selectors only (circuit type (204) in FIG. 2) will require approximately 2N drivers for an N×N array, while crossbar arrays having a nonvolatile switch plus a transistor operating each switch (circuit type (206) in FIG. 2) will require approximately $N^2$ transistors, plus 2N drivers. The number of transistors in this example will greatly increase the areal size of the memory over and above that required for the memory types having only a memory element associated with each cross point—i.e., memory types having only a programmable device or a programmable device plus a selector. The driver size is also a function of N, in that the driving transistor generally must be capable of delivering a current equal to N times the half-select current.

In addition, the support circuitry (125-1, 125-2) includes a sense amp, DC voltage sources, voltage bump selector switches, a bias voltage-source, and a ground. The support circuitry may include a number of additional components, such as addressing circuitry. The operation of the sense circuitry in reading and writing to the memory devices in the memory array is described In more detail below. Additionally, a controller (150) is illustrated. The controller (150) is programmed to operate the crossbar memory array (120) to either read data from the array (120) or write data to the array (120) for storage. The controller (150) will also control the voltage sources to effect reading or writing of the data.

Figure 4:
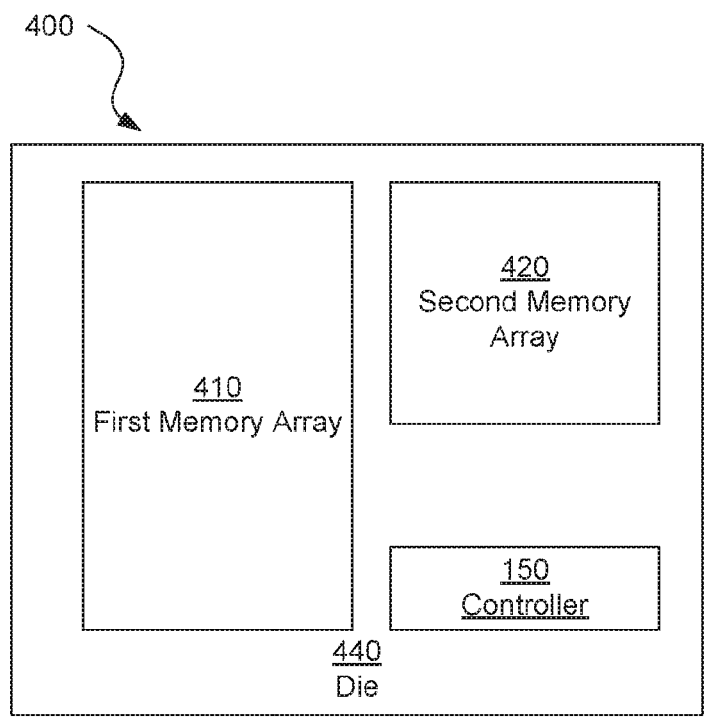
FIG. 4 illustrates the layout of several memory arrays on a single chip according to one example of the principles disclosed herein.

FIG. 4 illustrates an example of a non-volatile memory device (400) with multiple latency tiers. As shown in FIG. 4, this memory device (400) includes at least first and second crossbar memory arrays (410, 420). The two crossbar memory arrays (410, 420), each have a different latency. For example, the first crossbar array (410) could be constructed using the memory circuit (206) that requires a transistor be operably connected to each memory element, as described above. In one example, the transistors will not be located In the first cross bar array (410), hut in an adjacent CMOS array. The second crossbar array (420) could be constructed using the memory circuit (202) that simply includes a memory device, such as a memristor, and no selector. As shown in FIG. 4, the crossbar memory arrays (410, 420) may have different sizes. Also, in this example, the first crossbar array (410) may have a lower data density than the second crossbar array (420). As indicated above; however, the supporting circuitry will impact the ultimate comparative size of the arrays. In this example, the two crossbar memory arrays (410, 420) are formed on a single die (440). Because the types of memory arrays and tiers described herein, and other memory examples, can be formed using the same fabrication techniques, these memory arrays having different constructions and characteristics can nevertheless be formed on a single die in a single fabrication process. The memory device (400) also includes a media controller (150) to control ail of the crossbar memory arrays and to control reading data from or writing data to respective crossbar memory arrays or other arrays on the same or other chips depending on the location of the controller. In the illustrated example, the controller (150) may be circuitry formed on the same single die (440). Alternatively, the controller may be a separate device from the die (440) and memory arrays (410, 420).

Figure 5:
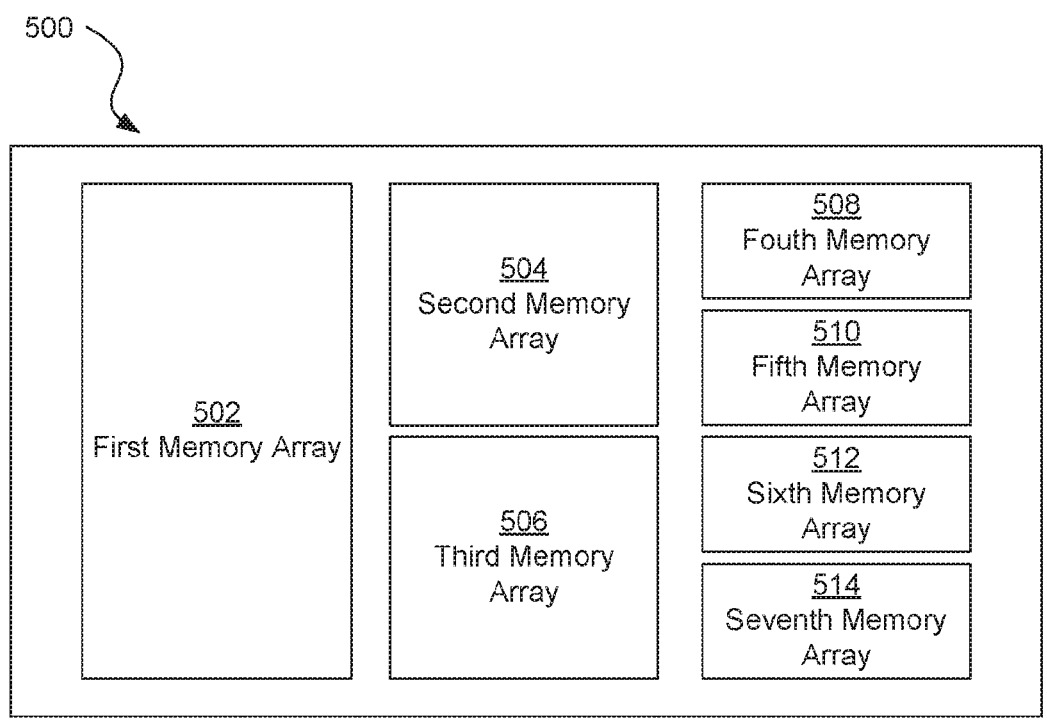
FIG. 5 illustrates another layout of several memory arrays on a single chip according to one example of the principles disclosed herein.
Figure 6:
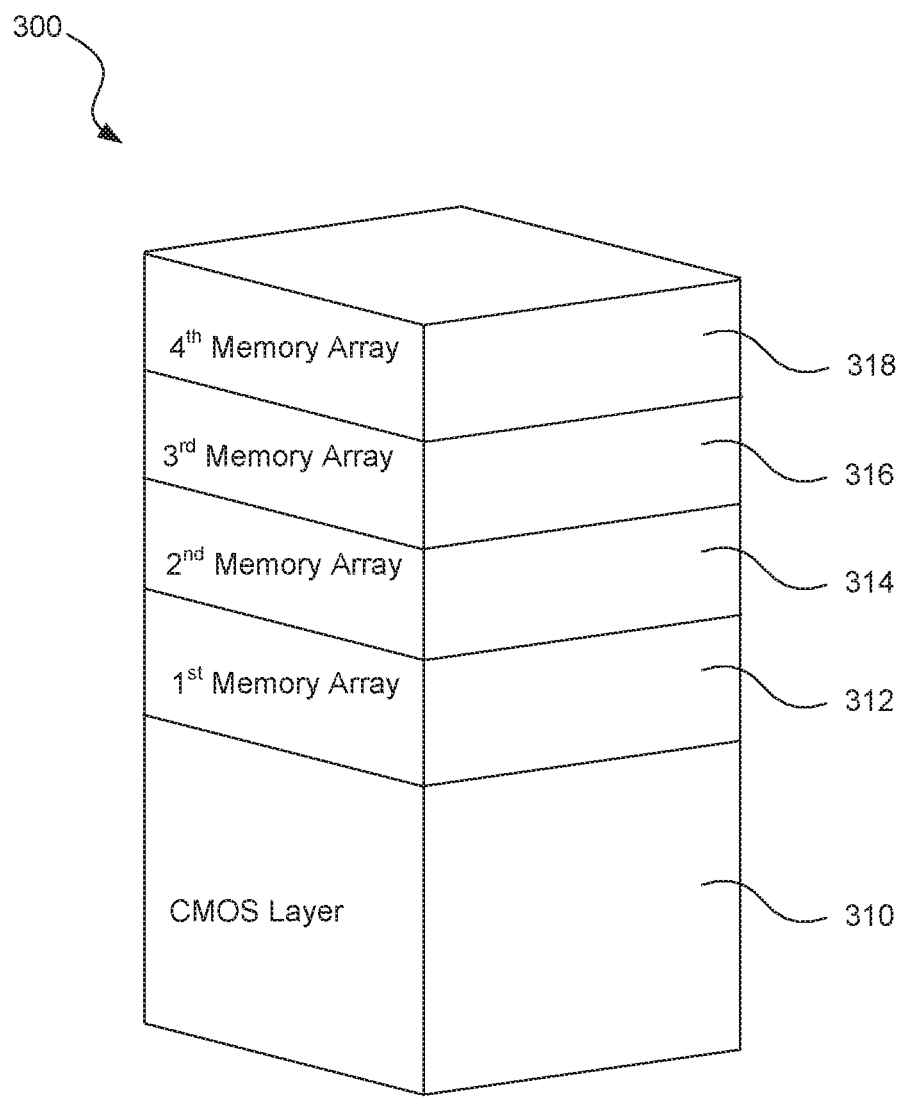

FIG. 5 illustrates another example of the principles disclosed herein, in which multiple crossbar memory arrays of different type or size are implemented on a single die. Referring to FIG. 5, for example, a single memory chip (500) is illustrated having several crossbar arrays having different structures and size and operational characteristics. In this example, the memory chip (500) includes a first crossbar array (502), a second crossbar array (504) and a third crossbar array (506). As in the previous example, the different arrays are constructed using different types of memory cells, as described above, so as to have different data density and latency characteristics. In one example, the first crossbar array (602) has dimension $M_1$ rows by $N_1$ columns. The second crossbar array (504) has dimension $M_2$ rows by $N_2$ columns, hut only roughly half the areal footprint. The third crossbar array (506) has dimension $M_3$ rows by columns, also on half the areal footprint. As stated above, the actual areal footprints—e.g., the footprints that include supporting circuitry, such as CMOS transistors—will be impacted by the size of the dimension of the array. However, varying the densities by adjusting the dimensions or areal footprints or varying the memory type will result in memory arrays having different density and latency characteristics that can be exploited as discussed below. Similar considerations may apply to additional arrays on the same chip (500)—i.e., the fourth, fifth, sixth and seventh crossbar arrays (508, 510, 512, 514)—providing a range of memory densities, $D_1$-$D_7$, and latencies based on the dimension of the arrays, the areal footprints and the types of memory cells and accompanying circuitry.

The foregoing characteristics can be beneficially exploited according to the principles of the disclosure provided herein. For example, associated with the range of densities, $D_4$-$D_7$, of each crossbar array is a range of cost per bit and latency. In addition, arrays using similar cells but of different dimensions can be accompanied with greater values for parasitic resistance and capacitance, which can lead to longer settling times and, therefore, slower latency. The range in characteristics can be exploited to optimize system performance by designating higher performance crossbar arrays within the single memory chip (500) to tasks requiring high-performance, such as cache memory, and by designating lower performance arrays to tasks requiring relatively low-performance, such as system memory.

Figure 8:
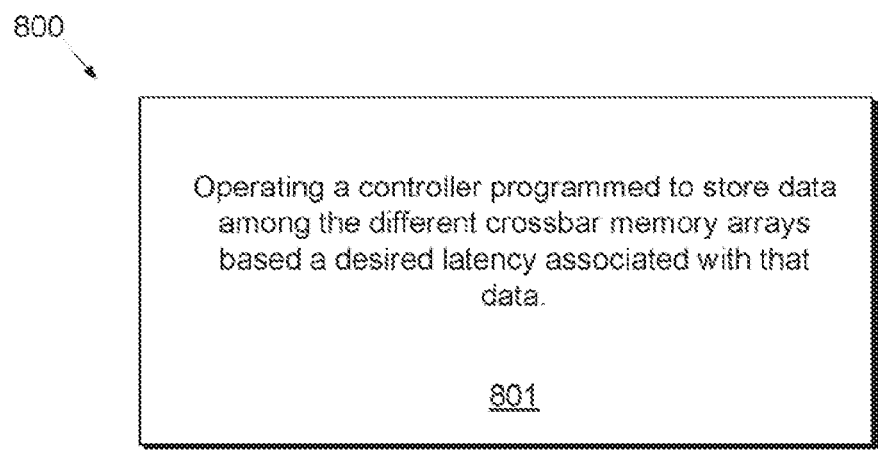
FIG. 8 illustrates a multi-layer circuit which includes a CMOS layer and multiple crossbar arrays according to one example of the principles disclosed herein.

In still another example of the principles disclosed herein, multiple NVM device types are processed on top of CMOS circuitry that supports each of the memory types. For example, arrays of spin transfer torque RAM ("STTRAM") with cross bar arrays of ReRAM or memristor devices are processed on the top of CMOS circuitry. Referring to FIG. 8, for example, a cross-sectional view of an illustrative multi-layer circuit, which includes a CMOS layer and multiple crossbar arrays is provided. Specifically, a multi-layer circuit (300) includes a CMOS layer (310) (which can constitute multiple CMOS layers) and first (312), second (314), third (316) and fourth (318) crossbar arrays, in one example, the first array (312) includes 1T1R-based memory elements (e.g., memory elements (222) in FIG. 2) located at each of the intersecting rows and columns, with the accompanying transistors (e.g., transistors (220) in FIG. 2) located in the CMOS layers, the second array is a crossbar array (314) that includes 1S1R devices at each of the intersecting rows and columns, each 1S1R device having a particular memristive matrix/dopant material, the third crossbar array (316) being similar to the second crossbar array, except for having a different memristive matrix/dopant material, and the fourth crossbar array including basic memristors at each of the intersecting rows and columns. Other examples include other combinations of densities and types of crossbar arrays for each of the crossbar array locations in the multi-layer circuit.

According to other examples of the principles disclosed herein, control functionality is incorporated with the different forms of memory circuitry in order to manage and coordinate data flow between the different performance tiers for various functionalities. As noted above, a memory device or chip as described herein may include or be in communication with a controller. The controller operates to read data from and write data to the various tiers of the multi-tier memory device described herein.

Because the different crossbar arrays can be manufactured in a single manufacturing process and, in various examples, on a single die, a single controller can access and control ail of the multiple crossbar memory arrays. This single controller can be programmed to store data according to what memory characteristics best match the data. For example, if the data is being used relatively frequently, it should be stored in memory with low latency, even though this may mean using data with a lower data density. If, however, the data is not being accessed frequently, it can be stored in memory with a higher latency while still being efficient. The frequency with which data is accessed, and other characteristics, can be graded to determine in which tier of the multi-latency memory device that data should be stored.

For example, the controller can expose the heterogeneous latencies of different arrays to the operating system and the application layer so that the operating system or application allocates critical pages (data) to the fast memory and non-critical pages to slow regions. As another example, the controller handles everything transparently to the application layer. In this case, it reshuffles pages between slow and fast tiers based on heuristics such as access count, access frequency, or access recency. The controller then notifies the new physical address to the operating system to update the virtual to physical mapping of remapped pages. In other examples, the controller hides the fast region to both operating system and application layer. It simply uses the fast layer as another level of cache, or a large row buffer to speedup accesses with high locality.

For example, some fast access tiers of memory may be in direct communication with the controller while other fast tiers are used internally and without direct communication with the controller for background operations that assist in masking or accomplishing necessary system behavior, such as operations associated with I/O or data transfer. The controller can also follow different scheduling policies for different tiers or regions of memory. For fast access regions, the controller can directly write the data to the memory without buffering. For slow access regions, the controller can either use a write buffer or a cache to avoid blocking critical reads.

In a design where different memory arrays have different latencies, the row buffer sizes associated with each array can also be adjusted to tradeoff energy versus latency. Having a large row buffer will help applications with high locality since once the page is open, subsequent accesses to the open page will be faster. But applications with random access patterns will not benefit from this and poor row buffer utilization will lead to wasted energy. Fast access regions can have smaller row buffers, but still support quick turn-around time. On the other hand, slow regions may have longer buffers to leverage spatial and temporal locality in the applications. In another possible application, the multi-tiered nonvolatile memory described herein can be used as a performance buffer to a larger pool of denser, and, therefore lower cost storage resources, in a manner that is also non-volatile, as opposed to a volatile memory buffer fronting nonvolatile memory.

Figure 7A:
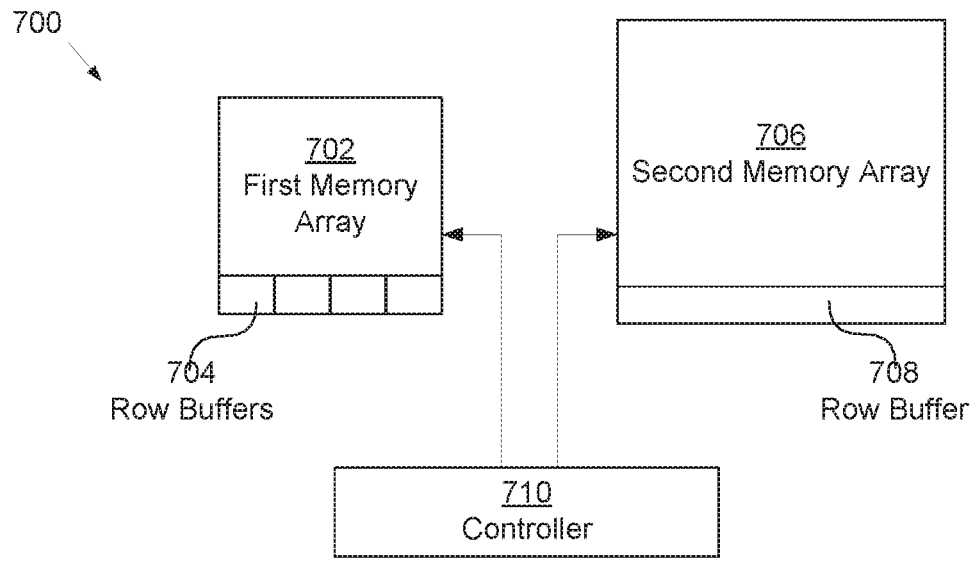
FIGS. 7A and 7B illustrate exemplar memory systems having arrays with different latencies according to the principles described herein.
Figure 7B:
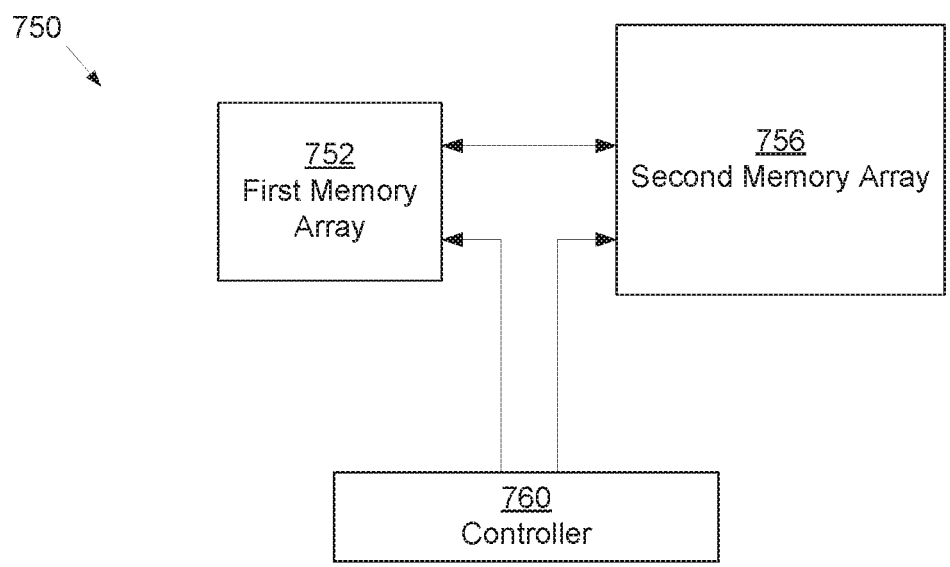

Referring to FIG. 7A, for example, a memory system (700) includes a first array (702) of relatively fast memory and a second array of relatively (706) slow memory. The first array (702) includes a plurality of short row buffers (704) while the second array (706) includes a single long row buffer (708). The first array (702), in one example, provides random access memory or cache memory. Thus, the array benefits from having a series of relatively short row buffers (704) that provides fast access to the memory. The second array (708), on the other hand, is larger and exhibits high locality and relatively high access latency. This array, therefore, beneficially includes a row buffer that is relatively large. The system (700) also includes a controller (710) that exploits the latencies, localities and buffer sizes by directing which memory should be accessed for particular storage tasks. Similarly, FIG. 7B illustrates a memory system (750) having relatively fast (752) and slow (756) memory arrays. A controller (760) communicates with the arrays. The controller (780) is configured to exploit the latencies and localities of the arrays by managing data exchanges between the arrays and updating the virtual to physical mapping of the exchanged data. In other examples, the controller (760) dedicates the fast memory array (752) as cache memory, which could be used as a row buffer for larger memory arrays having high locality. Consistent with the above description and principles described herein, the above described memory systems may be formed on single dies during a single fabrication process, and may be accompanied by several tiers and types of memory.

As illustrated in FIG. 8, a method (800) of operating a non-volatile memory device as described herein includes operating (801) a controller programmed to store data among the different crossbar memory arrays based a desired latency associated with that data. Thus, the controller carefully schedules requests to ensure that shared global resources are used efficiently without conflicts. This avoids the need for arbitration circuits for the system I/O buses or other shared logic between fast and slow arrays, which can both increase cost and result in unpredictable latencies for given requests.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A non-volatile memory device with multiple latency tiers comprising:
    at least two crossbar memory arrays, each crossbar memory array comprising a number of memory cells, each memory cell connected to a word line and a bit line at a cross point;
    wherein memory cells of a first crossbar memory array comprise different circuit elements than memory cells of a second crossbar memory array such that the at least two crossbar memory arrays each have a different latency due to the different circuit element composition of memory cells in respective crossbar memory arrays; and
    wherein the at least two crossbar memory arrays are formed on a single die.

2. The device of claim 1, further comprising a controller, wherein said controller is to control all of the crossbar memory arrays to read data from or write data to respective crossbar memory arrays.

3. The device of claim 2, wherein the controller comprises circuitry formed on the same single die.

4. The device of claim 1, wherein the at least two crossbar memory arrays have a different data density.

5. The device of claim 1, wherein said at least two crossbar memory arrays were formed with a single fabrication process.

6. A non-volatile memory device with multiple latency tiers comprising:
    at least two crossbar memory arrays, each crossbar memory array comprising a number of memory cells, each memory cell connected between word lines and bit lines of the array at a cross point, wherein a first of the two crossbar memory arrays has a different latency than a second of the two crossbar memory arrays because memory cells of the first crossbar memory array have a different circuit element composition than memory cells of the second crossbar memory array, the at least two crossbar memory arrays being formed on a same single die; and
    a controller, wherein said controller is configured to control any of the crossbar memory arrays to read data from or write data to respective crossbar memory arrays.

7. The device of claim 6, wherein the at least two crossbar memory arrays are stacked vertically on each other.

8. The device of claim 7, wherein the controller and the at least two crossbar memory arrays are formed on the same single die.

9. The device of claim 6, wherein the controller is configured to write data to memory without buffering to fast arrays.

10. A non-volatile memory device with multiple latency tiers comprising:
    at least two crossbar memory arrays, each crossbar memory array comprising a number of memory cells, each memory cell connected between a word line and a bit line at a cross point, wherein the at least two crossbar memory arrays have a different latency;

a first row buffer for a first crossbar memory array having a relatively low latency;

a second row buffer for a second crossbar memory array having a relatively high latency, the second row buffer being larger than the first row buffer; and a controller, wherein said controller is to control all of the crossbar memory arrays to read data from or write data to respective crossbar memory arrays.

11. The device of claim 10, wherein the at least two crossbar memory arrays are formed on a single die.

12. The device of claim 10, wherein the first crossbar memory array has a plurality of smaller row buffers, and the second crossbar memory array has a single long row buffer.

13. A method of operating the non-volatile memory device of claim 10, comprising operating the controller which is programmed to store data among the different crossbar memory arrays based a desired latency associated with that data.

14. The method of claim 13, wherein said desired latency associated with a set of data is determined by how frequently that set of data is being accessed.

15. The method of claim 13, further comprising buffering data in said non-volatile memory device for a pool of additional storage resources.

16. The device of claim 1, wherein within each memory cell of both of the crossbar memory array has a circuit element arrangement comprising one of: (1) only a memory element; (2) a memory element connected to a selector; and (3) a memory element connected to a transistor;

wherein all the memory cells of the first crossbar memory array have a first, same circuit element arrangement and all the memory cells of the second crossbar memory array have a second, same circuit element arrangement that is different from the first circuit element arrangement.

17. The device of claim 6, the controller to store data that is accessed with a higher relative frequency in one of the crossbar memory arrays having a lower latency than another of the crossbar memory arrays, and to store data that is accessed with a relatively lower relative frequency in one of the crossbar memory arrays having a higher latency than another of the crossbar memory arrays.

18. The device of claim 6, the controller to expose the different latencies of the memory arrays to an operating system and application layers and receive instructions as to which memory array should be used to store data for the operating system or application layers based on latency.

19. The device of claim 6, the controller to utilize one of the memory arrays having a relatively lower latency as a level of cache.

20. The device of claim 6, wherein within each memory cell of both of the crossbar memory array has a circuit element arrangement comprising one of: (1) only a memory element; (2) a memory element connected to a selector, and (3) a memory element connected to a transistor;

wherein all the memory cells of the first crossbar memory array have a first, same circuit element arrangement and all the memory cells of the second crossbar memory array have a second, same circuit element arrangement that is different from the first circuit element arrangement.

* * * * *